United States Patent
Oster et al.

(10) Patent No.: US 7,567,095 B2
(45) Date of Patent: Jul. 28, 2009

(54) SAFE OUTPUT CIRCUIT WITH A ONE-CHANNEL PERIPHERAL TERMINAL FOR THE OUPUT OF A BUS USER

(75) Inventors: Viktor Oster, Blomberg (DE); Carsten Landwehr, Lemgo (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 11/770,919

(22) Filed: Jun. 29, 2007

(65) Prior Publication Data

US 2008/0012623 A1    Jan. 17, 2008

(30) Foreign Application Priority Data

Jun. 29, 2006    (DE)    ........................ 10 2006 030 448

(51) Int. Cl.
*H03K 19/0175*    (2006.01)
(52) U.S. Cl. ........................................ 326/82; 326/136
(58) Field of Classification Search ............. 326/82–83, 326/136
See application file for complete search history.

(56) References Cited

U.S. PATENT DOCUMENTS 4,647,794 A * 3/1987 Guajardo .................... 327/109

| | | | |
|---|---|---|---|
| 5,182,456 A | 1/1993 | Beezley | |
| 5,559,466 A * | 9/1996 | Okumura et al. | 327/514 |
| 6,172,552 B1 * | 1/2001 | Tamai et al. | 327/427 |
| 2005/0083614 A1 | 4/2005 | Beaudion et al. | |

FOREIGN PATENT DOCUMENTS

| | | |
|---|---|---|
| DE | 1149810 | 6/1963 |
| DE | 195 07 073 A1 | 9/1996 |
| DE | 69820837 T2 | 11/2004 |
| EP | 0 660 484 A2 | 6/1995 |
| EP | 1628399 A1 | 2/2006 |

* cited by examiner

*Primary Examiner*—Anh Q Tran
(74) *Attorney, Agent, or Firm*—DeMont & Breyer, LLC

(57) ABSTRACT

The invention relates to an output circuit for an output module for switching at least one connected load. The task of the invention is to present a circuit for output-side switching of at least one connected load, especially a circuit that also satisfies the standards DIN EN 954-1 or IEC 61508.

The invention proposes an output circuit for an output module for switching at least one connected load, especially an inductive load, which is distinguished by a one-channel peripheral terminal (PA) for connecting the one or more loads and which comprises at least two driver modules (101; 102), especially FET transistors, connected in series between a power-supply voltage and the peripheral terminal, wherein each of the driver modules is connected to a logic unit assigned to the output module for controlling the driver modules via a separate control channel (OUT_LK1, IC10; OUT_LK2; IC20).

21 Claims, 3 Drawing Sheets

SAFE OUTPUT CIRCUIT WITH A ONE-CHANNEL PERIPHERAL TERMINAL FOR THE OUPUT OF A BUS USER

DESCRIPTION

The invention relates to an output circuit for an output module, especially a bus output module, for switching at least one connected load.

For the output of safety-related signals to actuators or loads, for example, contactors, motors, relays, etc., especially in safety engineering, high demands are placed on the error recognition and failure behavior of the circuit as well as the peripherals, which must also satisfy, for example, the standards DIN EN 954-1 or IEC 61508. For meeting these demands, typically complex, two-channel structures have been required for the output circuit until now, which means an increased outlay in the realization of the circuitry and in the switching of the peripherals, i.e., especially also with reference to the wiring to the actuator. Such circuits thus have a very complex configuration and are consequently also cost-intensive. Due to the increased requirements for components, the circuits also usually have relatively poor availability.

Figure 3:
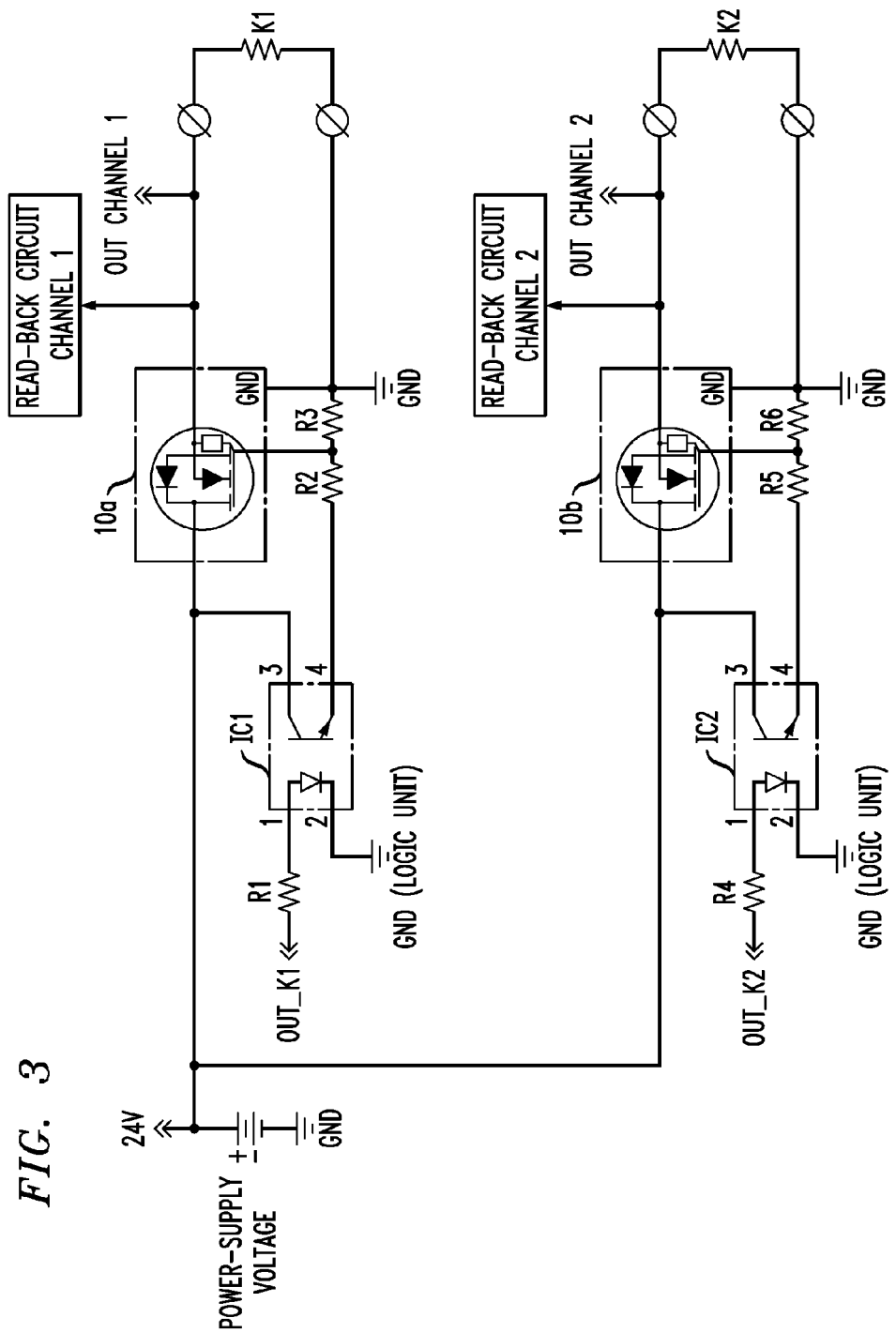

FIG. 3 shows a circuit according to the state of the art for controlling and switching two-channel actuators. According to the circuit from FIG. 3, an output driver component 10a and 10b is provided for driving a load channel K1 and K2, respectively. Consequently, when testing the circuit, test pulses are also always visible or present at the output, since otherwise the problem-free operation of each driver component 10a or 10b could not be tested. However, such test pulses visible at the output can disrupt a connected load. This also applies, for example, if the test pulses are kept only rather short, because, for example, for quickly running machines, in which, for example, a linear motor is used, only a few milliseconds are required in order to achieve the final speed. Such a circuit according to the state of the art can therefore be used only conditionally or not at all for various electronic loads.

Another disadvantage is that the realization requires an increased number of components, which in turn creates increased space requirements. Thus, e.g., for testing each driver component 10a and 10b, a read-back circuit is necessary for each component. Furthermore, because an increased number of interfaces or terminals to the peripherals must be provided for loads to be connected with redundancy, an increased number of protection elements is also necessary. If such a circuit or a similar circuit for switching inductive loads is used, problems are also produced in the interaction between inductive loads and the driver components used in the output circuit.

Because the energy stored in inductive loads conventionally leads to inductive switching energy, which can lead to overloading the driver component and consequently can also destroy this component, manufacturers typically specify connecting external protection, which absorbs the energy stored in the load. Otherwise, for example, in the case of an overloaded output driver component, whose internal temperature monitoring responds to overheating, the driver component would be disconnected and the disconnection would have the result that the inductive disconnect energy of the load would also be absorbed by the driver, which could lead to its destruction. The specified protection circuits are designed to limit the resulting negative disconnect voltages to a value at which the driver component is no longer loaded or loaded only within non-critical limits.

The problem of the invention is to present a novel and significantly improved circuit relative to the state of the art for output-side switching of at least one connected load, in particular a circuit that also satisfies the standards DIN EN 954-1 or IEC 61508.

A solution to the problem according to the invention is given by the subject matter with the feature of Claim 1.

Advantageous and/or preferred configurations, uses, refinements, and modules including the circuit according to the invention are the subject matter of the other claims.

For an output circuit for an output module, especially a bus output module, for switching at least one connected load, especially an inductive load, the invention proposes to form this circuit with a one-channel peripheral terminal for connecting the one or more loads and at least two driver modules connected in series between a power-supply voltage and the peripheral terminal, especially FET transistors, wherein each of the driver modules is connected via a separate control channel to a logic unit assigned to the output module for controlling the driver module.

Here, an essential advantage is that during normal operation these can always be switched simultaneously due to the series circuit of the driver module and as a result of the summed reverse voltages of the two or more driver modules, in the case of connecting an inductive load, inductive disconnect energy can be limited to the negative value of the power-supply voltage.

Another advantage consists in that the one-channel peripheral terminal also allows the connection of at least two-channel loads or of redundant loads due to the disconnect paths provided by the two or more output drivers. Through the increased safety created by disconnecting the load, the circuit according to the invention is especially advantageous particularly for use in safety engineering.

Another advantage consists in that a possible error occurring in one component does not necessarily affect both disconnect paths due to the separate control paths for the connection and disconnection of each driver module.

Thus, a load channel can be assigned to each of the driver modules via the common peripheral terminal, so that the circuit can also be used for building two or more channels, wherein the requirements specified especially in safety engineering for two or more channel systems in accordance with DIN EN 954-1 are also satisfied.

Another advantage consists in that, specific to the application, a plurality of different test cycles can be executed for testing each of the driver modules connected in series, and consequently the circuit according to the invention also allows flexible, multi-purpose use for different environmental conditions.

In a preferred refinement, a suppressor diode is connected after the driver modules, preferably parallel to the one or more loads that can be connected.

In this case, the failure of the suppressor diode leads to a short circuit, which, however, according to the invention, leads to short-circuiting of the output and which represents an advantageous refinement because the failure leads to a safe arrangement for the use, in particular, in the field of safety engineering. If protective components are already present in the load, they execute the full effect and also relieve the suppressor diode.

Furthermore, because during the disconnection process no current flows through the power supply, in the circuit according to the invention, optionally only energy stored in the load is absorbed. This produces a relatively small load on the protection elements, especially the suppressor diode, so that the circuit as a whole can be realized significantly more cost-effectively than according to the state of the art.

Because in the preferred use of the suppressor diode, essentially any disconnect energy is absorbed directly at the output and not in the driver modules, the permissible switching frequency is also significantly higher, which is advantageous, in turn, for using the circuit according to the invention for applications in which the output voltage is controlled by the pulse-to-pause ratio, as is the case, for example, in analog output circuits.

Because the invention leads to shortened fall times of the contacts of a load, the service life of such a load, for example, a relay, contactor, or motor, is also significantly longer than in circuits according to the state of the art. Another advantage is that significantly improved reaction times can be achieved through the faster disconnection of the load, which is also especially advantageous, in particular, for use in safety engineering.

Thus, because the circuit according to the invention must be designed overall for less energy to be absorbed, the costs associated with the circuit also decrease. In addition, the EMV (electromagnetic compatibility) properties also increase.

For further reduction of components and wiring expense, according to another practical embodiment, a common read-back circuit is provided for both output drivers, which is arranged, in turn, preferably parallel to the peripheral terminal and thus parallel to the one or more loads that can be connected. Furthermore, through the preferred arrangement of the optional application-specific, further-configurable read-back circuit, this can be used for different test methods.

In particular, through such a common read-back circuit, it is easy to test both output drivers individually in terms of their functionality, wherein a test procedure in this respect is performed in the set or not-set state of the driver by connecting and disconnecting the driver modules one after the other for short time intervals and by detecting the corresponding output voltage. If the output drivers are tested in the not-set state, the test pulse sequence can be selected so that a display of the corresponding test pulses at the output is stopped, which is especially advantageous for use in safety engineering, because the circuit according to the invention can be tested through targeted control of the driver module at 100% without having to fear an undesired effect on connected loads. Here, preferably LOW states are detected.

According to another preferred embodiment of the circuit according to the invention, in the case of the use of redundant loads or actuators, an output-side load or an output-side load channel is assigned to each of the driver modules, wherein the loads or load channels are connected in parallel to each other at the peripheral terminal.

Preferably, each of the driver modules is connected to the logic unit with galvanic separation, wherein the galvanic separation is realized especially by means of optocouplers. In this way, e.g., the exclusion of failure due to short circuits between the different voltage areas is guaranteed in advance. The separate control channels each with galvanically separated areas between the driver modules and the logic unit guarantee, in particular, that an overvoltage in one channel area has no effect on another channel area.

Preferably, a voltage divider is further arranged between an optocoupler and the corresponding driver module to be controlled.

In another preferred construction, the construction of the circuit is to be realized on the basis of discrete components. Also, the integration at least of the driver modules within a common component and optionally the further integration of the suppressor diode within the common component is advantageous, because a common charge pump, over-temperature, and over-current monitoring device can be used and a common component requires lower space requirements and can be designed more economically.

The circuit according to the invention can preferably be used for switching an actuator-protective circuit element and/or integrated within an output module, which is part of a master, a safety controller and/or a field unit.

Figure 1:
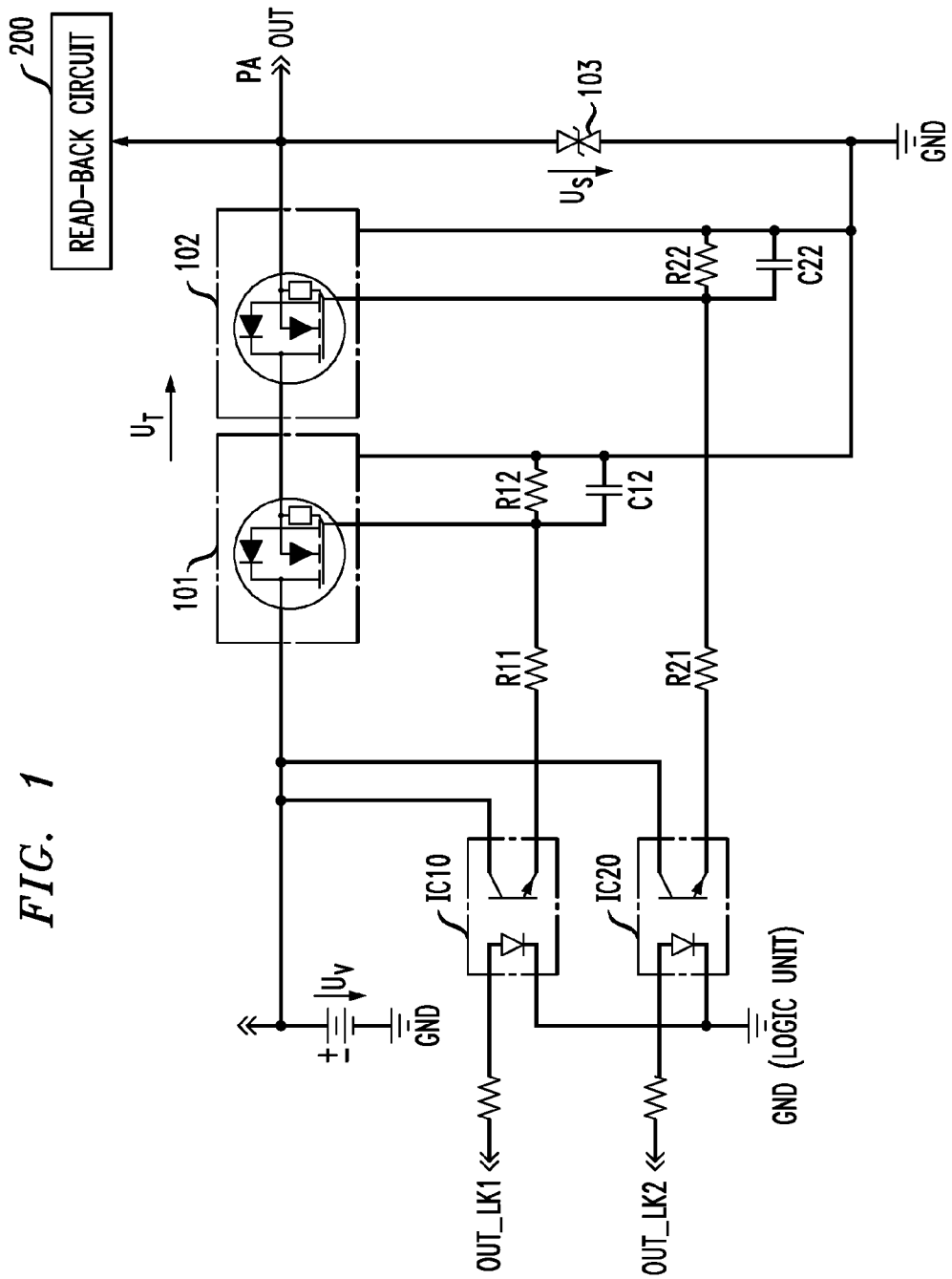
Figure 2:
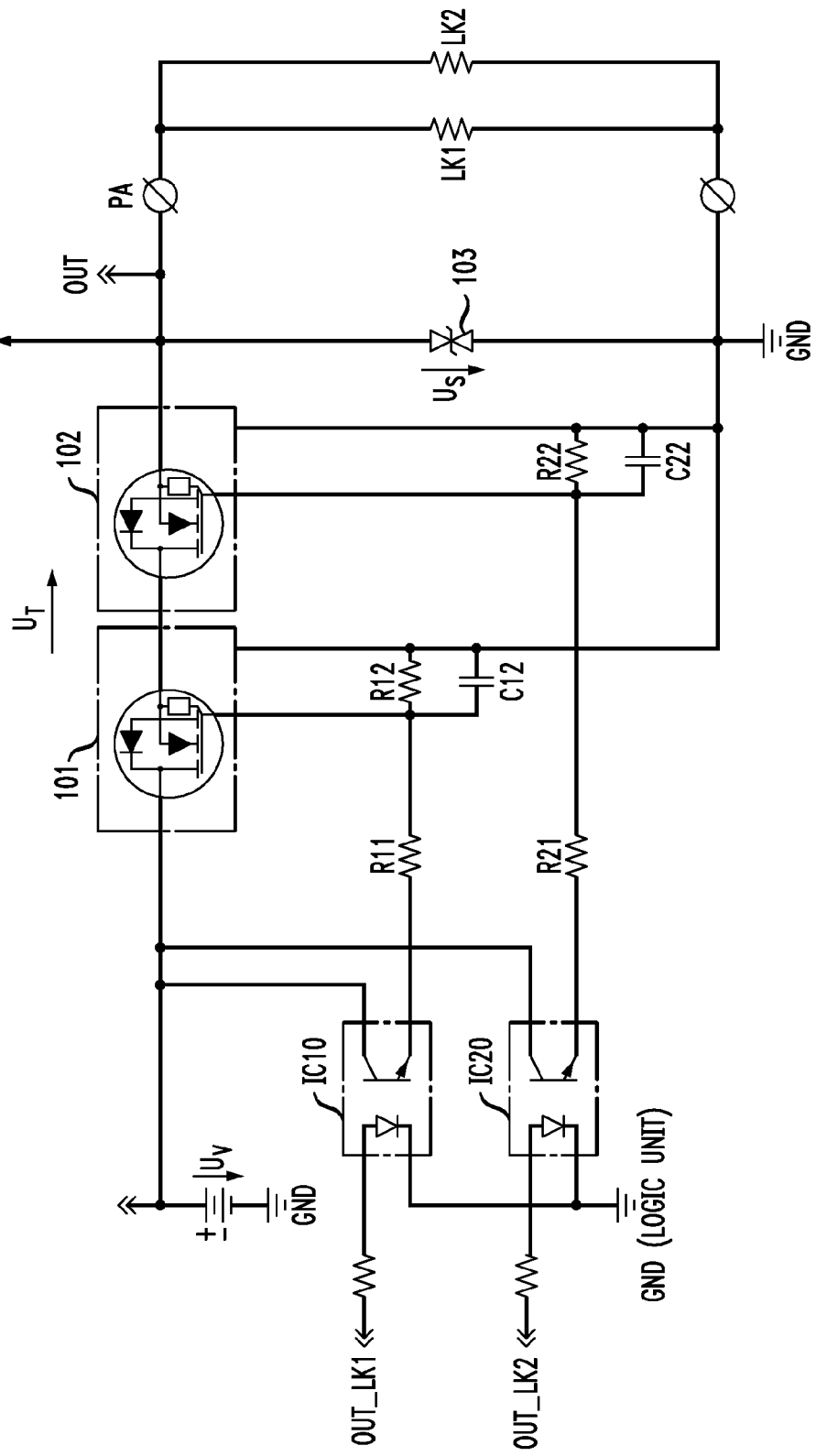

The invention is described in more detail below using a preferred embodiment with reference to the enclosed drawings. Shown in the drawings are:

FIG. 1, the configuration of an output circuit according to the invention,

FIG. 2, the circuit according to FIG. 1 with loads connected in parallel to the one-channel peripheral terminal, and FIG. 3, an output circuit according to the state of the art.

Below, reference is made to FIGS. 1 and 2, which show an output circuit according to the invention, made up of discrete components, with a one-channel peripheral terminal "PA" for an output module for connecting at least one load, e.g., an inductive load, to be connected to the peripheral terminal, which is constructed, e.g., in the form of a terminal.

In the embodiment shown, the circuit comprises two output drivers 101 and 102, which are connected in series between the common peripheral terminal PA and the power-supply voltage $U_V$. The output drivers are constructed in the present case on the basis of FET transistors. If multi-channel loads or actuators or redundant loads or actuators are connected or used, the corresponding load channels LK1 and LK2 are connected in parallel to each other to the peripheral terminal PA of the output circuit, as can be seen in FIG. 2.

The output drivers 101 and 102 are each connected via a separate control channel OUT_LK1 or OUT_LK2 to a logic unit assigned to the output module for controlling the output driver. The connection between the not-shown logic unit and the associated output drivers 101 and 102 is realized via interconnected optocouplers IC10 and IC20, respectively, so that the logic area and the peripheral area are galvanically separated from each other. For preparing a driver input voltage, the emitter terminals of the optocouplers IC10 and IC20 are respectively connected to the gate terminals of the output drivers 101 and 102, where the circuit is suitably dimensioned specifically to the application. In the present example, the circuit comprises voltage dividers, each made up of two resistors R11 and R12, and R21 and R22 respectively, and capacitors C12 and C22, respectively connected in parallel to the resistors R12 and R22, and also connected to ground. The capacitors C12 and C22 connected between the gate terminal and ground are used here specifically for improved EMV.

Through the control paths separated in this way and the disconnect paths held ready by means of the two output drivers 101 and 102, in the illustrated embodiment, the connection of both one-channel and also two-channel actuators to the one-channel peripheral terminal PA is also allowed while maintaining the safety requirements according to Category 4 DIN 954 and SIL 3 IEC 61508.

For protection from overvoltage and especially from inductive disconnect energy in the case of inductive loads, a suppressor diode 103 is further connected to the output with a maximum voltage of, for example, 35 V. The suppressor diode 103 is connected in parallel to the load that can be connected and also protects the output circuit according to the invention from the EMV interference.

It should be noted that the output drivers 101 and 102 and other components, e.g., the suppressor diode 103, can also be integrated within a common component.

In the case of inductive loads, the inductive disconnect energy is absorbed essentially only internally by the suppressor diode 103. Due to the output circuit realized by the output drivers 101 and 102 connected in series, when disconnecting one or two inductive loads, no energy is absorbed by the output drivers 101 and 102. Because the output drivers 101 and 102 are connected in series and preferably both can be simultaneously connected and disconnected during normal operation, the maximum disconnect voltage over two output drivers 101 and 102 when disconnecting an inductive load is composed as follows. A load L is connected at the output or the peripheral terminal.

If the maximum power-supply voltage $U_V=30$ V and if the terminal voltage $U_S$ of the suppressor diode 103 equals 35 V, then the maximum permissible voltage $U_T$ over both output drivers is as follows:

$$U_T > U_V + U_S = 65 \text{ Volt.} \tag{1}$$

Due to the series circuit, however, the maximum voltage is divided in half over both output drivers 101 and 102 from 65 V, and thus loads each of the output drivers with approximately 33 V. The voltage of the parasitic Zehner diode of each output driver 101 or 102, however, typically equals 45 V, so that these Zehner diodes of the output drivers are not conductive.

Furthermore, the circuit according to the invention comprises a common read-back device 200, which is connected downstage to the output drivers 101 and 102 and which is preferably arranged parallel to the load that can be connected. Especially for testing the output drivers 101 and 102, only one common read-back device 200 is required, wherein the output drivers 101 and/or 102 are connected and/or disconnected one after the other at short intervals and the corresponding state of the output voltages is read back via the read-back circuit 200, as described in more detail below. In this way, a diagnosis with one-hundred percent error coverage of the circuit can be realized. According to the application-specific circuit construction, the read-back device 200 can further be used for testing a plurality of additional components.

Based on the configuration of the output circuit according to the invention described above, three preferred methods for testing the output drivers 101 and 102 are described below, wherein, with the aid of the read-back device 200 the state of the output on the peripheral terminal PA is detected and compared with a desired state.

In a first method, in which test pulses are visible on the output or applied to the output, the test is performed in the set state, i.e., in the "high state" of the output drivers 101 and 102. In the set state, the output drivers 101 and 102 are here tested by means of disconnect pulses, wherein preferably a maximum width of the test pulse is defined. For each test pulse, of the two drivers 101 and 102 connected in series, only one, that is, the output driver 101 or 102, is always tested. This test pulse is visible on the output and is detected by the read-back circuit 200. According to the connected load, if such test pulses should have a interfering effect on this load, then this can be counteracted, e.g., by buffer capacitors and additional decoupling diodes. An example test sequence of this first method comprises the following steps:

First both output drivers 101 and 102 are in the set state. Then one of the output drivers is reset and the "low state" is detected on the output by the read-back circuit 200. Then this output driver is set again and the "high state" is detected by the read-back circuit 200. Test pulses are in turn visible on the output. Then the other output driver is reset and the "low state" is detected on the output by the read-back circuit 200. Then this other output driver is set again an the "high state" is detected by the read-back circuit. Because the test pulses are only of short period, here the thermal load on the output drivers is negligible.

Other possibilities consist in testing the circuit in the not-set state.

In a first variant of testing the circuit in the not-set state ("LOW state"), the output drivers are tested in the not-set state by means of connection pulses. So that here a connected load cannot be switched through, in this test, each connection period, i.e., the connection pulse, must be kept as small as possible. An example test sequence of this first variant comprises the following steps:

First, both output drivers 101 and 102 are in the not-set state. Then both output drivers are set and the "high state" of the circuit is detected at the output by the read-back circuit 200. Then a first driver is reset and the "low state" of the circuit is detected by the read-back circuit 200. Then this first output driver is set again and the "high state" is detected on the output by the read-back circuit 200. Then the second output driver is reset and the "low state" of the circuit is detected on the output by the read-back circuit 200. Then the first output driver is also reset again.

In another variant of testing the circuit in the not-set state ("LOW state"), the output drivers are set in the not-set state by changing the test sequence, such that the test pulses are stopped at the output. Such a variant is especially preferred because, due to the test pulses that are not visible at the output, a connected load is not disrupted by the test pulses. An example test sequence of such a second variant comprises the following steps:

First, both output drivers 101 and 102 are in the not-set state. Then a first output driver is set and the "low state" is detected at the output by the read-back circuit 200. Then this first driver is reset again and the "low state" is detected by the read-back circuit 200. Then the second output driver is set and the "low state" is detected on the output by the read-back circuit 200. Then this second driver is reset again and the "low state" is detected by the read-back circuit 200.

This test is also sufficient for Category 4 in accordance with DIN EN 954 or SIL 3 in accordance with DIN EN 61508, if each output driver remains connected over a suitable time interval without a state change being detected, so that a defect of the other output driver can be ruled out.

The circuit according to the invention is thus preferably suitable for switching safety-related actuator-protective switching elements, e.g., in the form of relays, contactors, or motors and/or is integrated with an output module not shown in more detail, especially a bus output module, which is preferably part of a master, a safety controller, and/or a field unit.

The invention claimed is:

1. Output circuit for an output module for switching at least one connected load, the output circuit comprising:
    a one-channel peripheral terminal (PA) for connecting the one or more loads; and
    at least two driver modules (101; 102) connected in series between a power-supply voltage and the peripheral terminal, wherein each of the driver modules is connected via a separate control channel (OUT_LK1, IC10; OUT_LK2, IC20) with a logic unit assigned to the output module for controlling the driver module;
    wherein an output-side load can be assigned to each of the driver modules, wherein the loads can be connected in parallel with the peripheral terminal.

2. Output circuit according to claim 1, further comprising a suppressor diode (103), which is connected after the driver modules.

3. Output circuit according to claim 2, characterized in that the suppressor diode is connected in parallel with the peripheral terminal.

4. Output circuit according to claim 1, further comprising a common read-back circuit (200).

5. Output circuit according to claim 4, further characterized in that the common read-back circuit is arranged in parallel with the peripheral terminal.

6. Output circuit according to claim 1, characterized in that each of the driver modules is connected to the logic unit in a galvanically separated arrangement.

7. Output circuit according to claim 6, further characterized in that a voltage divider (R11, R12; R21, R22) is connected between an optocoupler and a driver module.

8. Output circuit according to claim 1, further characterized by a construction based on discrete components.

9. Output circuit according to claim 1, further characterized by the integration of the driver module with a common component.

10. Output circuit according to claim 9, further characterized by the integration of a suppressor diode with the common component.

11. Output circuit according to claim 1, wherein the output module is a bus output module.

12. Output module comprising an output circuit according to claim 1.

13. Output module according to claim 12, which is part of a master, a safety controller, and/or a field unit.

14. Output module according to claim 12, which is a bus output module.

15. A method for switching an output voltage as a function of a certain pulse-to-pause ratio, the method comprising utilizing the output circuit according to claim 1.

16. The method of claim 15, wherein the output circuit is part of an analog output circuit.

17. The method of claim 15 wherein the output circuit is utilized in safety engineering.

18. A method for driving an actuator protective switching element, the method comprising utilizing the output circuit according to claim 1.

19. Output circuit according to claim 1, wherein the output circuit is testable in the set or not-set state of the driver modules, wherein each of the driver modules is connectable or disconnectable one after the other at short intervals and the corresponding output voltage is detectable.

20. Output circuit according to claim 1, wherein to test the output circuit in the not-set state of the driver modules, the driver modules are connectable and disconnectable in a test sequence, such that a display of the test pulses that are used is stopped at the output.

21. Output circuit according to claim 20, further comprising means for generating each of the test pulses for detecting LOW states of the circuit.

* * * * *